United States Patent
Bhatti et al.

(10) Patent No.: US 7,438,124 B2
(45) Date of Patent: Oct. 21, 2008

(54) EVAPORATIVE COOLING SYSTEM FOR A DATA-COMMUNICATIONS CABINET

(75) Inventors: Mohinder Singh Bhatti, Amherst, NY (US); Ilya Reyzin, Williamsville, NY (US); Shrikant Mukund Joshi, Williamsville, NY (US)

(73) Assignee: Delphi Technologies, Inc., Troy, MI (US)

( * ) Notice: Subject to any disclaimer, the term of this patent is extended or adjusted under 35 U.S.C. 154(b) by 571 days.

(21) Appl. No.: 11/242,731

(22) Filed: Oct. 4, 2005

(65) Prior Publication Data

US 2007/0074866 A1    Apr. 5, 2007

(51) Int. Cl.
*F24F 11/04* (2006.01)

(52) U.S. Cl. .................. 165/248; 165/80.2; 165/122; 454/184; 62/259.1

(58) Field of Classification Search ............... 165/248, 165/299, 120, 121, 122, 80.1, 80.2, 80.3, 165/80.4, 80.5; 454/184, 185, 186; 62/132, 62/259.1, 259.2
See application file for complete search history.

(56) References Cited

U.S. PATENT DOCUMENTS

| 3,253,646 | A | * | 5/1966 | Koltuniak et al. | ............ 165/299 |
| 5,226,590 | A | * | 7/1993 | Davis | ............ 62/229 |
| 5,740,018 | A | * | 4/1998 | Rumbut, Jr. | ............ 165/46 |
| 6,506,111 | B2 | | 1/2003 | Sharp | ............ 454/184 |
| 6,616,524 | B2 | * | 9/2003 | Storck et al. | ............ 454/184 |

* cited by examiner

*Primary Examiner*—Ljiljana (Lil) V Ciric
(74) *Attorney, Agent, or Firm*—Patrick M. Griffin

(57) ABSTRACT

An electronics cabinet for storing a plurality of electronic devices therein is provided and includes a fan and an evaporative cooler. The fan draws a flow of air into the cabinet, circulates the flow of air through the evaporative cooler, and then across the electronic devices for removing heat produced by the electronic devices. The evaporative cooler removes heat from the flow of air by absorbing heat from the flow of air and then dissipating the heat by evaporating a liquid into a secondary airflow, which is directed out of the cabinet. The cabinet includes a cold air plenum having an actuator for adjusting a cross-sectional area of the cold air plenum to control the airflow through each of the supports.

19 Claims, 2 Drawing Sheets

EVAPORATIVE COOLING SYSTEM FOR A DATA-COMMUNICATIONS CABINET

BACKGROUND OF THE INVENTION

1. Field of the Invention

The subject invention relates to a cabinet for supporting a plurality of electronic devices therein.

2. Description of the Prior Art

Electronics cabinets store and organize multiple electronic devices, such as computer data servers, in a central location. The electronic devices produce heat that accumulates inside of the cabinet, which may damage the electronic devices stored therein. The amount of heat that each of the electronic devices produces may vary within the cabinet, with some of the electronic devices producing more heat than others. Accordingly, the electronics cabinet may include a system for removing the heat from within the cabinet to maintain an optimum working environment for the electronic devices.

U.S. Pat. No. 6,506,111 to Sharp et. al. discloses an electronics cabinet for storing a plurality of electronic devices and a system for removing heat from within the cabinet. The cabinet is enclosed and includes a plurality of supports disposed within the cabinet for supporting the electronic devices. An air movement device, such as a fan, is disposed at the bottom of the cabinet for circulating a flow of air through the enclosure. A heat exchanger is disposed at the bottom of the cabinet for transferring the heat stored in the flow of air to a heat exchange medium passing through the heat exchanger. The heat exchange medium is disposed within a closed loop that circulates the heat exchange medium to a remote location from the electronics cabinet to remove the heat stored in the heat exchange medium. A cold air plenum is disposed within the cabinet and extends upwardly adjacent the electronic devices along a first side wall of the cabinet. A plurality of outlets is disposed in the cold air plenum with at least one of the plurality of outlets adjacent each of the supports for directing a portion of the flow of air into each of the supports. A warm air plenum is disposed within the cabinet and extends upwardly adjacent the electronic devices along a second side wall across from the cold air plenum. The warm air plenum receives the flow of air from the supports and directs the flow of air back to the heat exchanger. The air movement device draws the air from the warm air plenum and circulates the air through the heat exchanger to remove the heat therefrom. The flow of air is then directed into the cold air plenum and across the electronic devices, absorbing heat produced from the electronic devices, before entering the warm air plenum where the flow of air is re-circulated within the cabinet.

SUMMARY OF THE INVENTION AND ADVANTAGES

The subject invention provides a cabinet for supporting a plurality of electronic devices therein. The cabinet includes an enclosure and a plurality of supports disposed within said enclosure for supporting the electronic devices thereon. An air movement device draws a flow of air into the enclosure and circulates the flow of air through the enclosure. A cold air plenum is disposed within the enclosure and includes an inlet for receiving the flow of air from the air movement device and a flexible wall defining a cross-sectional area of the cold air plenum. A plurality of outlets is disposed along the cold air plenum with at least one of the plurality of outlets adjacent each of the supports for directing a portion of the flow of air at each of the supports. An evaporative cooler is disposed within the cabinet for absorbing heat from the flow of air. The evaporative cooler dissipates the heat stored therein by evaporating a liquid disposed on the evaporative cooler into a secondary airflow directed out of the enclosure. The cabinet includes an actuator for moving the flexible wall to change the cross-sectional area of the cold air.

Accordingly, the evaporative cooler removes heat from the flow of air without expending any additional energy. Additionally, the amount of air supplied to each of the supports may be varied to accommodate the specific design requirements of each of the electronic devices. Therefore the cabinet provides a more efficient system for removing heat from within the cabinet.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1:
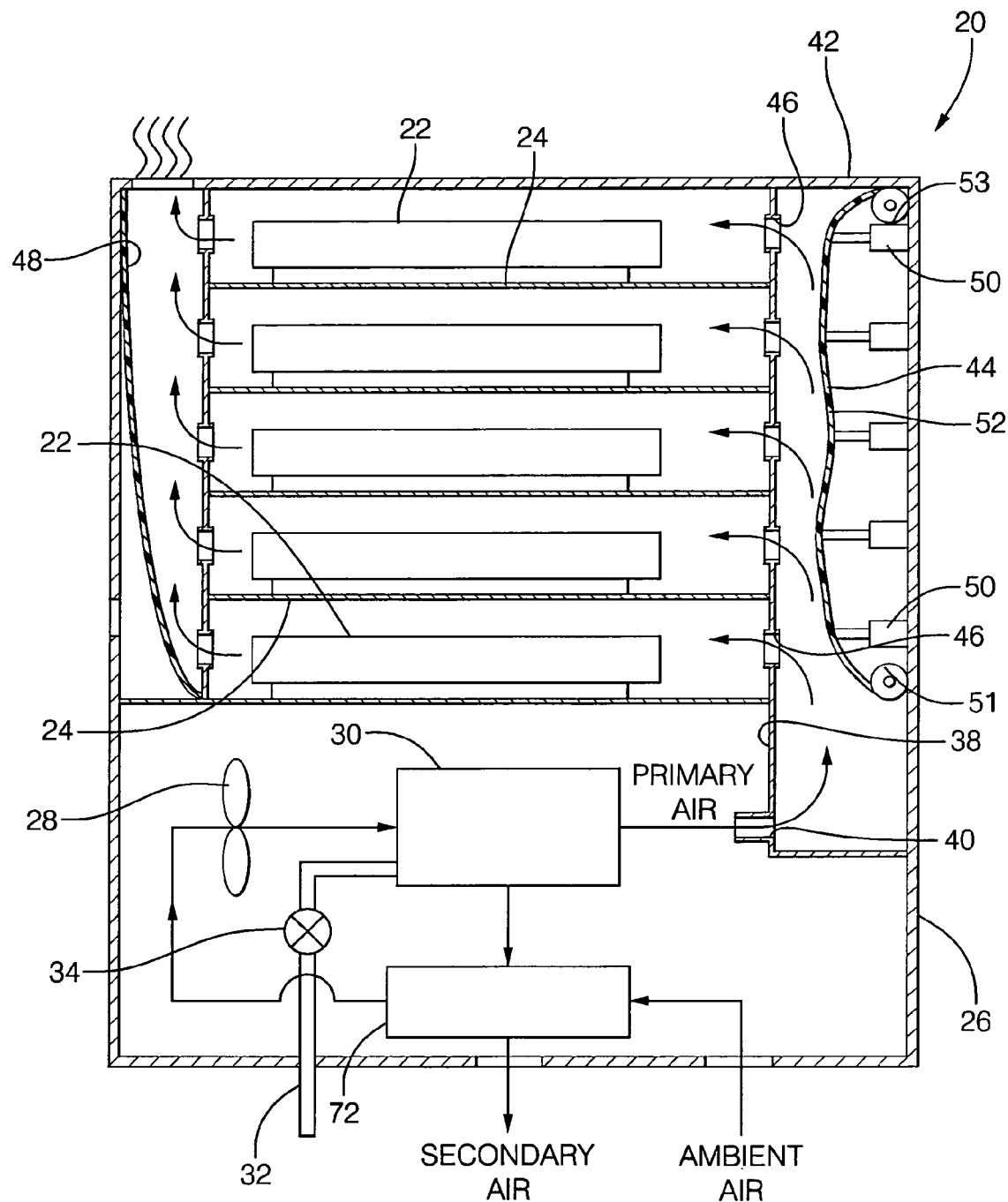
FIG. 1 is a schematic cross-sectional view of a cabinet.

Referring to the Figures, wherein like numerals indicate corresponding parts throughout the several views, a cabinet is shown in FIGS. 1 and 4 generally at 20.

Referring to FIG. 1, the cabinet 20 is for supporting a plurality of electronic devices 22 therein. The electronic devices 22 are typically computer data servers, but the cabinet 20 may be utilized to support any electronic device 22 and should not be limited to the type of device stored therein.

The cabinet 20 includes an enclosure 26 and a plurality of supports 24 disposed within the enclosure 26 for supporting the electronic devices 22 thereon. The enclosure 26 includes a plurality of outer walls, which surround the electronic devices 22 stored within the cabinet 20. The supports 24 may include a plurality of brackets, with the electronic devices 22 attached thereto. Alternatively, as depicted in FIG. 1, the supports 24 may include a plurality of shelves extending between the walls of the enclosure 26. The cabinet 20 is divided into an upper portion and a lower portion with the electronic devices 22 supported in the upper portion.

An air movement device 28 is disposed within the lower portion of the cabinet 20. The air movement device 28 draws a flow of ambient air into the enclosure 26 and circulates the flow of air through the enclosure 26. The air movement device 28 is typically an electric fan; however, any device capable of circulating the flow of air through the cabinet 20 may be utilized.

The cabinet 20 includes an evaporative cooler 30 and a liquid supply line 32 in fluid communication with the evaporative cooler 30 for supplying the evaporative cooler 30 with a liquid. The liquid is preferably water; however, any suitable liquid may be utilized and the scope of the invention is not limited to the type of liquid. A valve 34 is provided for opening and closing the liquid supply line 32 to control the flow of the liquid to the evaporative cooler 30. The valve 34 is controlled to only allow the liquid to flow into the evaporative cooler 30 when necessary to maintain a pre-determined water level. The valve 34 only permits liquid into the evaporative cooler 30 to replenish the liquid that is used during an evaporation process for dissipating heat from the evaporative cooler 30, which is described below.

A cold air plenum 38 is disposed within the upper portion of the cabinet 20 and is adjacent the supports 24. The cold air plenum 38 includes an inlet 40 for receiving the flow of air from the air movement device 28 and a terminal wall 42 spaced from the inlet 40. A flexible wall 40 defines a cross-sectional area of the cold air plenum 38 and extends from the inlet 40 a length to the terminal wall 42. A plurality of outlets 46 is disposed along the length of the flexible wall 40 with at least one of the plurality of outlets 46 adjacent each of the supports 24 for directing a portion of the flow of air at each of the supports 24.

A warm air plenum 48 is disposed within the upper portion of the cabinet 20 and adjacent the supports 24, across from the cold air plenum 38. The warm air plenum 48 receives the flow of air from the supports 24 and exhausts the flow of air from the cabinet 20. Accordingly, the cabinet 20 does not re-circulate the flow of air.

The cabinet 20 includes an actuator 50 for moving the flexible wall 40 closer to or farther from the supports 24 to change the cross-sectional area of the cold air plenum 38. The actuator 50 may include a plurality of actuators 50 with at least one of the plurality of actuators 50 adjacent each of the supports 24. Accordingly, the cross sectional area adjacent each of the plurality of supports 24 may be changed to accommodate any specific design requirements of the electronic devices 22 stored thereon. As shown, the flexible wall 40 includes a lower roller 51 and an upper roller 53 for tensioning the flexible wall 44. It is contemplated that any excess length of the flexible wall 40 may be wrapped around one or both of the rollers.

The flexible wall 40 provides the optimum airflow to all of the plurality of supports 24 by utilizing the available flow of air provided by the air movement device 28 in the most efficient manner. Each of the supports 24 includes an optimum temperature change ($\Delta T_{opt}$) in the flow of air therethrough, defined by the equation:

$$\Delta T_{opt} = \left[\left(\frac{2}{g_c}\right)\left(\frac{f}{\eta}\right)\left(\frac{\dot{q}^2 \dot{Q}}{P}\right)\left(\frac{l}{dA^2}\right)\left(\frac{1}{\rho^2 c_p^3}\right)\right]^{1/3} \quad (1)$$

where $\Delta T_{opt}$ is the optimum temperature (° F.) change in any of the plurality of supports 24, $g_c$ is the gravitational constant $(32.174^{lb_m \cdot ft}/_{lb_f \cdot s^2})$ in Newton's second law of motion, $f$ is the dimensionless friction factor in each of the supports 24, $\eta$ is the dimensionless efficiency of the air movement device 28, $\dot{q}$ is the heat generation rate $(^{Btu}/_s)$ in one of the supports 24, $\dot{Q}$ is the total heat generation rate $(^{Btu}/_s)$ of all of the supports 24, P is the power $(^{ft \cdot lb_f}/_s)$ of the air movement device 28, l is the length (ft) of one of the supports 24 between the cold air plenum 38 and the warm air plenum 48, d is the hydraulic diameter (ft) of one of the supports 24, A is the cross sectional area (ft²) of one of the supports 24, $\rho$ is the density $(^{lb_m}/_{ft^3})$ of the flow of air, and $c_p$ is the isobaric specific heat $(^{Btu}/_{lb_m \cdot ° F.})$ of the flow of air.

It should be understood that in the typical application, each of the electronic devices 22 produces a varying amount of heat and requires a different amount of air flowing through the respective supports 24 to remove the heat. In this situation, the cross-sectional area of the cold air plenum 38 will have a variable rate of change, with the cross-sectional area varying in size along the length of the flexible wall 44.

In limited applications, however, each of the electronic devices 22 produces the same amount of heat and requires the same amount of air flowing through the respective supports 24 to remove the heat. In this application, the cross-sectional area of the cold air plenum 38 will have a constant rate of change, with the cross-sectional area decreasing in size along the length of the flexible wall 44. Accordingly, the flexible wall 40 has a smaller cross-sectional area adjacent the terminal wall 42 than the cross-sectional area adjacent the inlet 40. In this limited application, the volume of air flowing through the cold air plenum 38 must be greater than or equal to the sum of the volume of air flowing through each of the supports 24. Based on this consideration, the dimension of the cold air plenum 38 are preferably in the range defined by the equation:

$$2 \leq \frac{a+b}{l} \leq 4 \quad (2)$$

where l is the length (ft) of one of the supports 24 between the cold air plenum 38 and the warm air plenum 48, a is the width (ft) of the cold air plenum 38 adjacent the inlet 40, and b is the width (ft) of the cold air plenum 38 adjacent the terminal wall 42.

Utilizing Equation 1, the optimal cross-sectional area of the cold air plenum 38 adjacent each of the plurality of supports 24 may be determined in the following manner. As a first step, beginning at the top of the cabinet 20, determine a temperature difference ($\Delta T$) in the flow of air entering and leaving the support 24. If the temperature difference ($\Delta T$) is greater than the optimum temperature change ($\Delta T_{opt}$) calculated from Equation 1, the actuator 50 is used to increase the cross-sectional area of the cold air plenum 38 by moving the flexible wall 40 away from the outlet 46 of the cold air plenum 38 adjacent the respective support 24. This will increase the flow of air into the support 24, lowering the temperature difference ($\Delta T$) and bringing it closer to the optimum temperature change ($\Delta T_{opt}$). If the temperature difference ($\Delta T$) is lower than the optimum temperature change ($\Delta T_{opt}$) calculated from Equation 1, the actuator 50 is used to decrease the cross-sectional area of the cold air plenum 38 by moving the flexible wall 40 toward the outlet 46 of the cold air plenum 38 adjacent the respective support 24. This will decrease the flow of air into the support 24 thereby raising the temperature difference ($\Delta T$) bringing it closer to the optimum temperature change ($\Delta T_{opt}$). This procedure is repeated sequentially from the support 24 closest the top of the cabinet 20 toward the support 24 closest the bottom of the cabinet 20. An additional iteration may be required to fine tune the adjustment of the flexible wall 40 to achieve the optimum temperature change ($\Delta T_{opt}$) for all of the electronic devices 22 in each of the supports 24.

Figure 2:
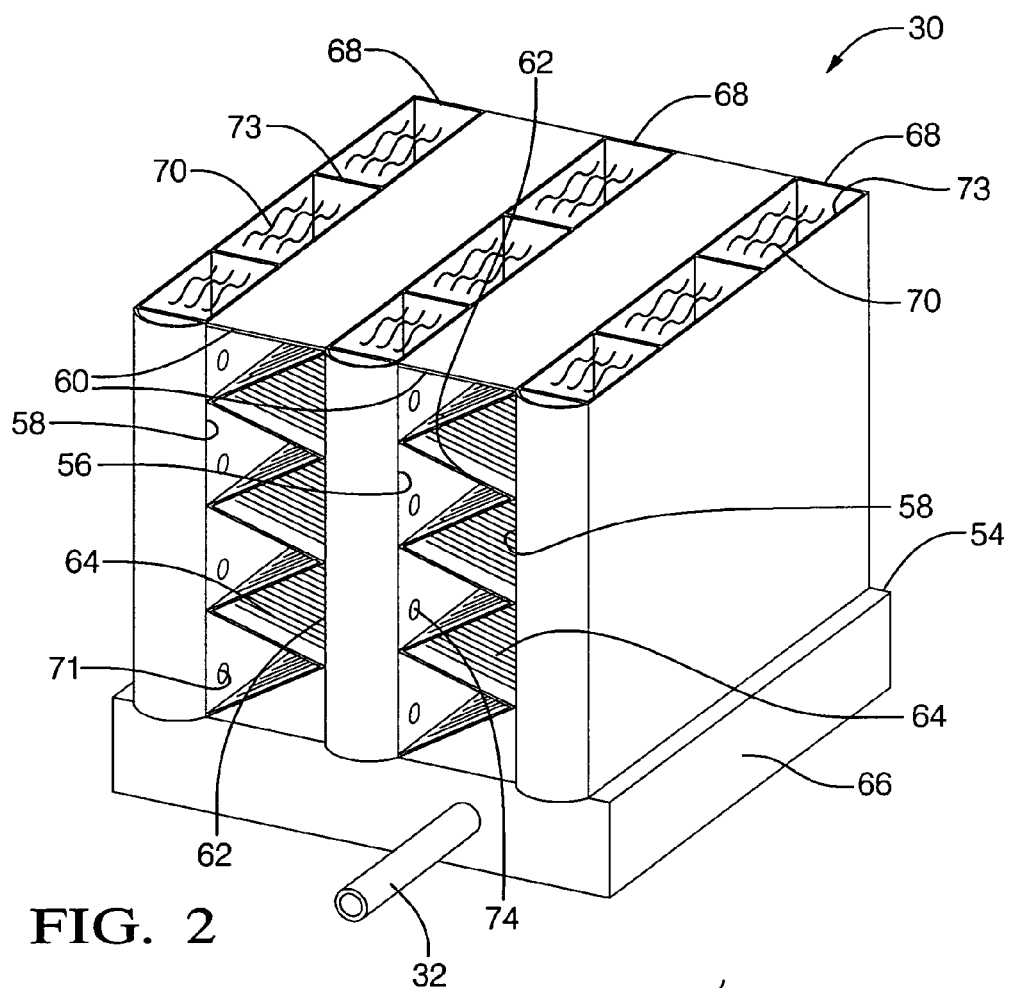
FIG. 2 is a perspective view of an evaporative cooler.

The evaporative cooler 30 is disposed within the lower portion of the cabinet 20. Referring to FIG. 2, the evaporative cooler 30 includes a base 54, a first wall 56, and a second wall 58 extending upwardly from the wall 54. The first wall 56 and the second wall 58 define a dry channel 60 therebetween for receiving the flow of air from the air movement device 28. The dry channel 60 includes a convoluted fin 62 for absorbing heat from the flow of air and conducting the heat to the first wall 56 and the second wall 58. The convoluted fin 62 includes a plurality of louvers 64 for creating turbulence in the flow of air crossing the convoluted fin 62 to increase a heat transfer rate between the flow of air and the convoluted fin 62. The base 54 of the evaporative cooler 30 includes a tank 66 for storing the liquid therein. The tank 66 is in fluid communication with and receives the liquid from the liquid supply line 32. At least one of the first wall 56 and the second wall 58 define a wet channel 68 therein with the wet channel 68 in fluid communication with the tank 66. The wet channel 68 includes a wicking material 70 for drawing the liquid from the tank 66 and into the wet channel 68. The first wall 56 and the second wall 58 define at least one opening 71 interconnecting the dry channel 60 and the wet channel 68 for directing a portion of the flow of air into the wet channel 68 to provide a secondary airflow through the wet channel 68 and a primary flow of air through the dry channel 60. The wet channel 68 includes an exit 73 for directing the secondary airflow from the wet channel 68 to the wet scrubber 72 and out of the enclosure 26.

Accordingly, the flow of air enters the dry channel 60 of the evaporative cooler 30 where the convoluted fin 62 absorbs heat from the flow of air as the flow of air passes over the convoluted fin 62. The convoluted fin 62 transfers the heat absorbed to the first and the second walls 56, 58. The secondary airflow enters the wet channel 68 through the openings 71 interconnecting the dry channel 60 and the wet channel 68. The liquid present in the wicking material 70 of the wet channel 68 evaporates into the secondary airflow, dissipating the heat from the evaporative cooler 30 into the secondary airflow. The secondary airflow is then directed through the exit 73 and out of the cabinet 20 via the wet scrubber 72. The cooled primary flow of air is directed to the cold air plenum 38 as described above.

A wet scrubber 72 is disposed within the lower portion of the cabinet 20 for removing particulate matter from the flow of air drawn into the cabinet 20. The secondary airflow from the evaporative cooler 30 flows through the wet scrubber 72 as the secondary airflow is directed out of the cabinet 20. The secondary airflow includes moisture from the evaporation of the liquid, which helps attract contaminants from the incoming flow of ambient air.

Figure 3:
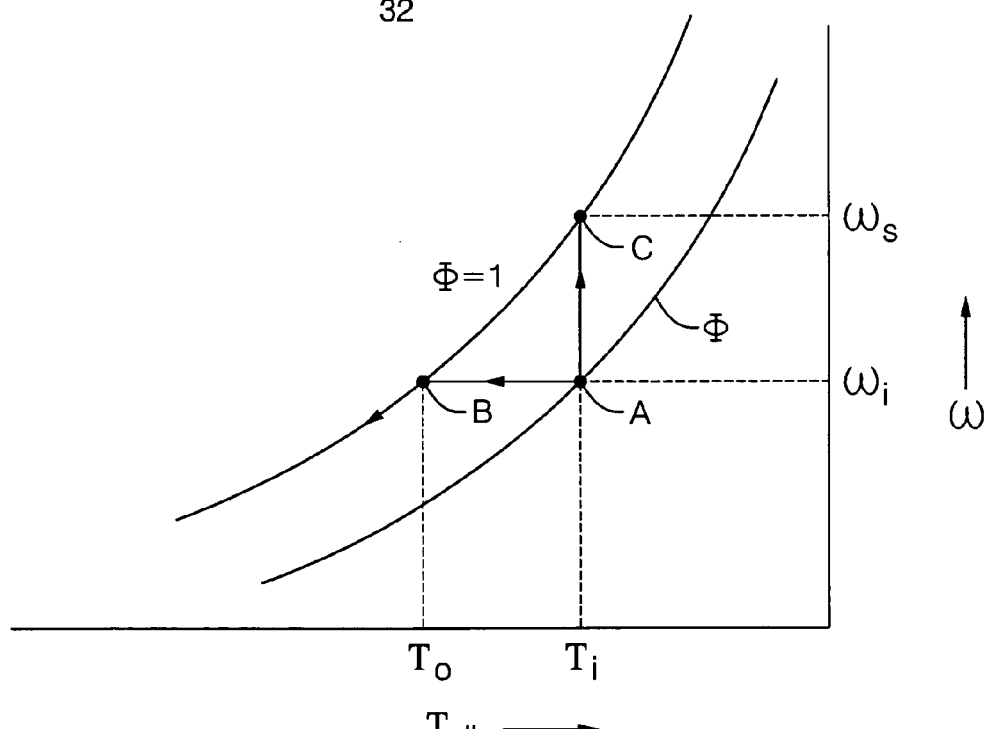
FIG. 3 is a psychrometric chart representing the evaporative cooling system of the cabinet.

Referring to FIG. 3, the psychometric chart for the process of cooling the flow of air is shown. The curved lines of the chart represent the relative humidity ($\Phi_i$) of the flow of air. Complete saturation occurs in the flow of air at a relative humidity ($\Phi_i$) equal to one. The flow of air enters the evaporative cooler 30 having an initial temperature ($T_i$) and an initial absolute humidity level ($\omega_i$) represented in FIG. 3 at point "A". As mentioned above, the evaporative cooler 30 separates the incoming flow of air into the primary flow of air and the secondary airflow. The primary flow of air passes through the dry channel 60 where the convoluted fin 62 absorbs heat from the primary flow of air, thereby lowering the temperature of the flow of air exiting the dry channel 60 of the evaporative cooler 30 without changing the absolute humidity. The primary flow of air exiting the evaporative cooler 30 is represented in FIG. 3 at point "B", and includes an outflow temperature ($T_o$), but maintains the initial absolute humidity level ($\omega_i$). The secondary airflow passes through the wet channel 68 of the evaporative cooler 30 without absorbing any heat. However, as discussed above, the secondary airflow picks up moisture from the evaporative cooler 30 as the liquid evaporates into the secondary airflow. The secondary airflow exiting the evaporative cooler 30 is represented in FIG. 3 at point "C", and includes an outflow absolute humidity level ($\omega_s$), but maintains the initial temperature ($T_i$). Accordingly, the primary flow of air which exits the evaporative cooler 30 has a lower temperature than the flow of air entering the evaporative cooler 30, but maintains the same volume of moisture, i.e., absolute humidity level ($\omega_i$). Therefore, the evaporative cooler 30 has cooled the flow of air that is circulated across the electronic devices 22 without adding any moisture into the air that may damage the electronic devices 22.

The foregoing invention has been described in accordance with the relevant legal standards; thus, the description is exemplary rather than limiting in nature. Variations and modifications to the disclosed embodiment may become apparent to those skilled in the art and do come within the scope of the invention. Accordingly, the scope of legal protection afforded this invention can only be determined by studying the following claims.

What is claimed is:

1. A cabinet for supporting a plurality of electronic devices therein, said cabinet comprising:
   an enclosure;
   a plurality of supports disposed within said enclosure for supporting the electronic devices thereon;
   an air movement device for drawing a flow of air into said enclosure and circulating the flow of air through said enclosure;
   a cold air plenum disposed within said enclosure and including an inlet for receiving the flow of air from said air movement device and a flexible wall defining a cross-sectional area of said cold air plenum;
   a plurality of outlets disposed along said cold air plenum with at least one of said plurality of outlets adjacent each of said supports or directing a portion of the flow of air at each of said supports; and
   an evaporative cooler disposed within said cabinet for absorbing heat from the flow of air and for dissipating the heat stored therein by evaporating a liquid disposed on said evaporative cooler into a secondary airflow directed out of said enclosure.

2. A cabinet as set forth in claim 1 wherein said cabinet includes an actuator for moving said flexible wall to change said cross-sectional area of said cold air plenum.

3. A cabinet as set forth in claim 2 wherein said cabinet includes a roller for tensioning said flexible wall.

4. A cabinet as set forth in claim 3 wherein said actuator includes a plurality of actuators with at least one of said plurality of actuators adjacent each of said supports for moving said flexile wall to change said cross-sectional area of said cold air plenum relative to each of said plurality of supports.

5. A cabinet as set forth in claim 4 wherein each of said supports includes an optimum temperature change ($\Delta T_{opt}$) in the flow of air therethrough defined by the equation:

$$\Delta T_{opt} = \left[ \left(\frac{2}{g_c}\right)\left(\frac{f}{\eta}\right)\left(\frac{\dot{q}^2 \dot{Q}}{P}\right)\left(\frac{l}{dA^2}\right)\left(\frac{1}{\rho^2 c_p^3}\right) \right]^{1/3}$$

where $g_c$ is a gravitational constant, $f$ is a dimensionless friction factor in each of said supports, $\eta$ is a dimensionless efficiency of the air movement device, $\dot{q}$ is a heat generation rate in on of said supports, $\dot{Q}$ is a total heat generation rate of all of said plurality of supports, P is a power of said air movement device, l is a length of said plurality of supports, d is a hydraulic diameter of said plurality of supports, A is a cross sectional area of said plurality of supports, $\rho$ is a density of the flow of air, $c_p$ is an isobaric specific heat of the flow of air.

6. A cabinet as set forth in claim 2 wherein said cabinet includes a liquid supply line in fluid communication with said evaporative cooler for supplying said evaporative cooler with the liquid.

7. A cabinet as set forth in claim 6 wherein said cabinet includes a valve for opening and closing said liquid supply line to control the flow of the liquid to said evaporative cooler.

8. A cabinet as set forth in claim 7 wherein said evaporative cooler includes a base and a first wall and a second wall extending upwardly from said base and defining a dry channel between said first wall and said second wall for receiving the flow of air from said air movement device.

9. A cabinet as set forth in claim 8 wherein said dry channel includes a convoluted fin for absorbing heat from the flow of air and conducting the heat to said first wall and said second wall.

10. A cabinet as set forth in claim 9 wherein said convoluted fin includes a plurality of louvers for creating turbulence in the flow of air crossing said convoluted fin.

11. A cabinet as set forth in claim 10 wherein said base of said evaporative cooler includes a tank for storing the liquid therein.

12. A cabinet as set forth in claim 11 wherein at least one of said first wall and said second wall define a wet channel therein with said wet channel in fluid communication with said tank.

13. A cabinet as set forth in claim 12 wherein said wet channel includes a wicking material for drawing the liquid from said tank into said wet channel.

14. A cabinet as set forth in claim 13 wherein at least one of said first wall and said second wall define at least one opening interconnecting said dry channel and said wet channel for directing a portion of the flow of air into said wet channel to provide a secondary airflow through said wet channel.

15. A cabinet as set forth in claim 14 wherein said cold air plenum includes a terminal wall spaced from said inlet and said flexible wall extends from said inlet a length to said terminal wall with said cross-sectional area of said cold air plenum decreasing in size along said length of said flexible wall and said flexible wall having a smaller cross-sectional area adjacent said terminal wall then adjacent said inlet.

16. A cabinet as set forth in claim 15 wherein said cold air plenum includes a first width (a), a second width (b), and a length (l) in the range defined by the equation:

$$2 \leq \frac{a+b}{l} \leq 4$$

where l is the length of one of said plurality of supports, a is said first width of said cold air plenum adjacent said inlet, and b is said second width of said cold air plenum adjacent said terminal wall.

17. A cabinet as set forth in claim 14 wherein said cabinet includes a warm air plenum for receiving the flow of air from said supports and exhausting the flow of air from said cabinet.

18. A cabinet as set forth in claim 17 wherein said cabinet includes a wet scrubber for removing particulate matter from the flow of air drawn into said cabinet.

19. A cabinet as set forth in claim 18 wherein said wet channel includes an exit for directing the secondary airflow from said wet channel to said wet scrubber and out of said enclosure.

* * * * *